United States Patent
Li

(10) Patent No.: US 10,516,059 B1
(45) Date of Patent: Dec. 24, 2019

(54) LOWER TEMPERATURE POLYCRYSTALLINE SILICON THIN FILM TRANSISTOR AND METHOD OF MANUFACTURE THEREOF AND OLED DISPLAY DEVICE

(71) Applicant: Wuhan China Star Optoelectronics Semiconductor Display Technology Co., Ltd., Wuhan, Hubei (CN)

(72) Inventor: Songshan Li, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 243 days.

(21) Appl. No.: 15/577,448

(22) PCT Filed: Sep. 5, 2017

(86) PCT No.: PCT/CN2017/100585
§ 371 (c)(1),
(2) Date: Nov. 28, 2017

(30) Foreign Application Priority Data

Jul. 27, 2017 (CN) .......................... 201710625402.4

(51) Int. Cl.
*H01L 29/786* (2006.01)
*H01L 27/32* (2006.01)
(Continued)

(52) U.S. Cl.
CPC .. *H01L 29/78675* (2013.01); *H01L 21/02532* (2013.01); *H01L 21/02595* (2013.01);
(Continued)

(58) Field of Classification Search
None
See application file for complete search history.

(56) References Cited

U.S. PATENT DOCUMENTS 5,767,531 A 6/1998 Yoshinouchi
6,974,972 B1 * 12/2005 Tanaka .............. H01L 29/42384
257/59
(Continued)

FOREIGN PATENT DOCUMENTS

CN 104347819 2/2015
CN 104485278 4/2015
(Continued)

*Primary Examiner* — Jack S Chen
(74) *Attorney, Agent, or Firm* — Hemisphere Law, PLLC; Zhigang Ma

(57) ABSTRACT

A LTPS TFT (Lower Temperature Polycrystal Silicon thin film transistor) is provided. The LTPS TFT includes substrate, poly-Si layer, gate insulation layer, grid, layer insulation layer, first through hole, second through hole, source and drain. The poly-Si layer includes an undoped layer, a heavily doped layers and a lightly doped layer. The gate insulation layer includes a first layer, a second layer and third layer respectively corresponding to undoped layer, lightly doped layer and third layer. The thickness of second layer is greater than sum of a thickness of first layer and third layer. A manufacture method of LTPS TFT and OLED display device are also provided in invention. The LTPS TFT of this invention has simplify manufacture method and low cost.

13 Claims, 5 Drawing Sheets

(51) Int. Cl.
- *H01L 21/02* (2006.01)
- *H01L 29/66* (2006.01)
- *H01L 21/265* (2006.01)
- *H01L 27/12* (2006.01)

(52) U.S. Cl.
CPC .... *H01L 21/26513* (2013.01); *H01L 27/3246* (2013.01); *H01L 27/3248* (2013.01); *H01L 27/3258* (2013.01); *H01L 27/3262* (2013.01); *H01L 29/66757* (2013.01); *H01L 29/78618* (2013.01); *H01L 27/1218* (2013.01); *H01L 27/1222* (2013.01); *H01L 27/1248* (2013.01); *H01L 27/1288* (2013.01); *H01L 2227/323* (2013.01)

(56) References Cited

U.S. PATENT DOCUMENTS

| | | | | |
|---|---|---|---|---|
| 9,786,789 | B2* | 10/2017 | Zhou | H01L 29/06 |
| 2005/0090045 | A1* | 4/2005 | Chang | H01L 27/1214 |
| | | | | 438/151 |
| 2014/0225075 | A1* | 8/2014 | Zhan | H01L 29/78672 |
| | | | | 257/40 |
| 2018/0033808 | A1* | 2/2018 | Li | H01L 21/02532 |
| 2018/0294344 | A1* | 10/2018 | Gong | H01L 29/66757 |
| 2019/0096918 | A1* | 3/2019 | Liu | H01L 27/1248 |

FOREIGN PATENT DOCUMENTS

| | | |
|---|---|---|
| CN | 105097550 | 11/2015 |
| CN | 105957814 A | 9/2016 |
| CN | 106876430 A | 6/2017 |
| CN | 106981520 A | 7/2017 |
| JP | 2005191212 | 7/2005 |

\* cited by examiner

LOWER TEMPERATURE POLYCRYSTALLINE SILICON THIN FILM TRANSISTOR AND METHOD OF MANUFACTURE THEREOF AND OLED DISPLAY DEVICE

RELATED APPLICATIONS

The present application is a National Phase of International Application Number PCT/CN2017/100585, filed on Sep. 5, 2017, and claims the priority of China Application No. 201710625402.4, filed on Jul. 27, 2017.

FIELD OF THE DISCLOSURE

The disclosure relates to manufacture of TFT (thin film transistor) technical field, and more particularly to LTPS TFT (Lower Temperature Polycrystalline Silicon thin film transistor) and method of manufacture thereof and OLED (organic light-emitting diodes) display device.

BACKGROUND

Flat panel display devices have been booming with the evolution of optoelectronic and semiconductor technologies, and in many types of flat panel display devices, liquid crystal display (LCD) devices and organic light-emitting diode (OLED) display devices have become the mainstream of market due to their many superior characteristics such as high space utilization efficiency, low power consumption, radiation-free and low electromagnetic interference.

Currently, amorphous silicon thin film transistor (a-Si TFT) is widely applied to switch element of the LCD display and OLED display. But the a-Si TFT have limits of meeting the requirements such as thin, light weight, high-finesse, high brightness, high reliability and low power consumption. Compared with the a-Si TFT, the LTPS TFT has significant advantages on the aspects of satisfying the above requirements.

However, it needs two mask processes to poly-Si layer for forming heavily doped region and lightly doped region, and then injecting ions twice for forming heavily doped layer and lightly doped layer in currently low temperature poly-Si TFT. Therefore, the manufacture method is complications and high cost.

SUMMARY

A technical problem to be solved by the disclosure is to provide LTPS TFT and method of manufacture thereof and OLED (organic light-emitting diodes) display device by using only one step for mask process, and forming heavily doped layer and light doped layer by one step ion injection.

Furthermore, the disclosure further provides a LTPS TFT. The LTPS TFT including a substrate, a poly-Si layer, a gate insulation layer, a grid, a layer insulation layer, a first through hole, a second through hole, a source and a drain. The poly-Si layer is positioned on the substrate, and the poly-Si layer includes an undoped layer, heavily doped layers respectively positioned on two sides of the undoped layer, and a lightly doped layer positioned between the undoped layer and the heavily doped layer. The gate insulation layer is positioned on the poly-Si layer, the gate insulation layer includes a first layer corresponding to undoped layer, a second layer corresponding to the lightly doped layer and a third layer corresponding to the heavily doped layer, a thickness of the second layer is greater than sum of a thickness of the first layer and a thickness of the third layer. The grid is positioned on the first layer. The layer insulation layer is positioned on the grid, the gate insulation layer and the substrate. The first through hole and a second through hole, the first through hole passes through the layer insulation layer and one part of the third layer, the second through hole passes through the layer insulation layer and another part of the third layer. The source and a drain are positioned on the layer insulation layer, the source and the drain are respectively pass through the first through hole and the second through hole and correspondingly contact to the heavily doped layers.

In an embodiment, the LTPS TFT further comprises a buffer layer positioned between the poly-Si layer and the layer insulation layer.

In an embodiment, the lightly doped layer is n-type lightly doped layer, and the heavily doped layer is n-type heavily doped layer.

According to another aspect of the disclosure, the disclosure further provides an OLED display device. The OLED display device includes a LTPS TFT as described above, a planar layer, a third through hole, a bottom electrode, a pixel defining layer, a fourth through hole, an OLED (organic light-emitting-diode) and a top electrode. The planar layer is positioned on the layer insulation layer, the source and the drain. The third through hole passes through the planar layer for exposing the drain. The bottom electrode is positioned on the planar layer and contacted to the drain by the third through hole. The pixel defining layer is positioned on the planar layer and the bottom electrode. The fourth through hole passes through the pixel defining layer for exposing the bottom electrode. The OLED (organic light-emitting-diode) is positioned on the bottom electrode. The top electrode is positioned on the OLED.

In an embodiment, the OLED further includes a hole injection layer, a hole transport layer, an organic emitting layer, an electron transport layer and a electron-injection layer arranged in sequence from the bottom electrode to the top electrode.

In an embodiment, one of the bottom electrode and the top electrode is transparent or semi-transparent, and another one is opaque and reflected.

According to yet aspect of the disclosure, the disclosure further provides a manufacture method of LTPS TFT, comprising the following steps. Providing a substrate. Forming a poly-Si layer on the substrate. Forming a gate insulation layer on the poly-Si layer, the gate insulation layer includes a first layer, third layers respectively positioned on two sides of the first layer and a second layer at positioned between the first layer and the third layer, a thickness of the second layer is greater than sum of a thickness of the first layer and a thickness of the third layer. Forming a grid on the first layer. Injecting ion into the poly-Si layer and forming an undoped layer corresponding to the first layer, a lightly doped layer corresponding to the second layer and a heavily doped layer corresponding to the third layer. Forming a layer insulation layer on the grid, the gate insulation layer and the substrate. Forming a first through hole and a second through holed on the layer insulation layer, and the first through hole passes through the layer insulation layer and one part of the third layer, and the second through hole passes through the layer insulation layer and other part of the third layer. Forming and filling the source to the first through hole for contacting the correspondingly heavily doped layer, and filing the drain to the second through hole for contacting the correspondingly heavily doped layer.

In an embodiment, before the step of forming a poly-Si layer on the substrate further comprises step of forming a buffer layer on the substrate. So that the step of forming a poly-Si layer on the substrate is substituted for the step of forming a poly-Si layer on the buffer layer; the step of forming a layer insulation layer on the grid, the gate insulation layer and the substrate is substituted for the step of forming a layer insulation layer on the grid, the gate insulation layer and the buffer layer.

In an embodiment, specifically steps of forming a gate insulation layer on the poly-Si layer comprising following steps. Forming an isolation material layer on the poly-Si layer and the substrate. Exposing the isolation material layer by a half tone mask. The half tone mask comprises a first portion corresponding to the first layer, a second portion corresponding to the second layer, a third portion corresponding to the third layer and a fourth portion corresponding to the isolation material layer on the substrate, transmittance of the fourth portion is greater than transmittance of the first portion, the second portion and the third portion, and transmittance of the first portion and the third portion are greater than the second portion. Developing and etching the exposed the isolation material layer.

In an embodiment, the lightly doped layer is n-type lightly doped layer, and the heavily doped layer is n-type heavily doped layer.

The advantages related to the present disclosure is that by using only one step for mask process, and forming heavily doped layer and light doped layer by one step ion injection which is simplify manufacture method and decrease cost.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
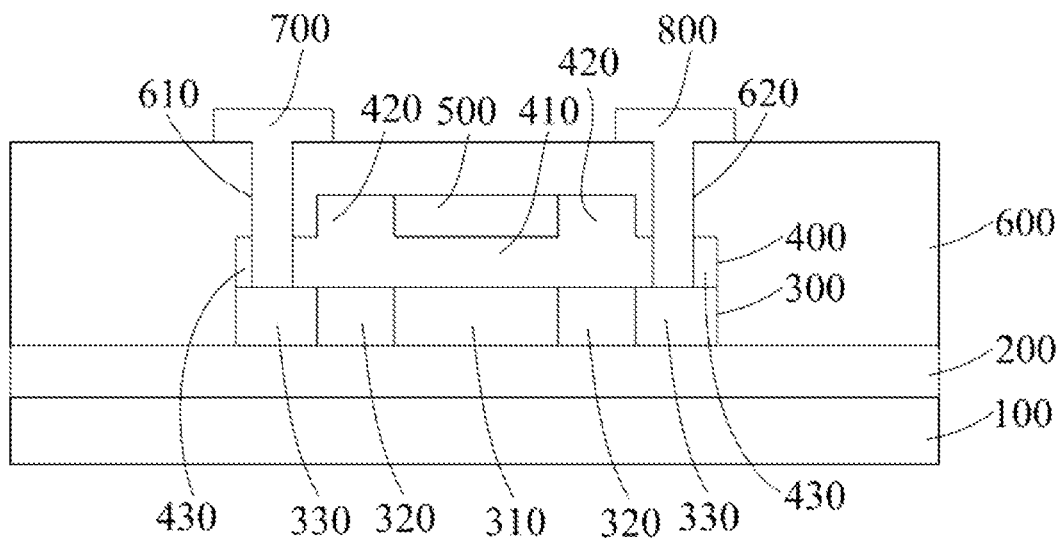
FIG. 1 is a structural schematic view of a LTPS TFT according to an embodiment of the disclosure.

Embodiments of the present invention will be described in detail below by referring to the accompany drawings. However, the present invention can be implemented in many different forms, and the present invention should not be construed as being limited to the specific embodiments set forth herein. Rather, these embodiments are provided so as to explain the principle and actual application of the present invention, thus other skilled in the art can understand various embodiments and amendments which are suitable for specific intended applications of the present invention.

In the drawings, thicknesses of layers and regions are exaggerated for the sake of clarity. The same reference numerals refer to like elements in the entire description and drawings.

When it is said that any part, such as a layer, film, region, or plate, is positioned on another part, it means the part is directly on the other part, or intervening part may also be present. In addition, it is said that any part is directly positioned on another part, it means there is no intervening part may also be present The disclosure will be further described in detail with reference to accompanying drawings and preferred embodiments as follows.

FIG. 1 is a structural schematic view of a LTPS TFT according to an embodiment of the disclosure;

Please refer to FIG. 1. In this embodiment, a LTPS TFT 10 including a substrate 100, a buffer layer 200, a poly-Si layer 300, a gate insulation layer 400, a grid 500, a layer insulation layer 600, a source 700 and a drain 800.

Specifically, the substrate 100 could be a transparent glass substrate or a resin substrate, the present disclosure is not limited thereto.

The buffer layer 200 is positioned on the substrate 100. The buffer layer 200 could be SiNx/SiOx structure, but the present disclosure is not limited thereto. For example the buffer layer 200 could be single layer of SiNx structure or SiOx structure. In another embodiment, there can not having the buffer layer 200.

The poly-Si layer 300 is positioned on the buffer layer 200. When there is no buffer layer 200 of the LTPS TFT, the poly-Si layer 300 is directly positioned on the substrate 100. The poly-Si layer 300 includes an undoped layer 310, heavily doped layers 330 and lightly doped layers 320. The heavily doped layers 330 are respectively positioned on two sides of the undoped layer 310. The lightly doped layer 320 is positioned between the undoped layer 310 and the heavily doped layer 330. In this embodiment, the lightly doped layer 320 is n-type lightly doped layer, and the heavily doped layer 330 is n-type heavily doped layer. It is not limited thereto. For example the lightly doped layer 320 could be p-type lightly doped layer, and the heavily doped layer 330 could be p-type heavily doped layer.

The gate insulation layer 400 is positioned on the poly-Si layer 300. The gate insulation layer 400 comprises a first layer 410, a second layer 420 and a third layer 430. The first layer is corresponding to undoped layer 310. The second layer 420 is corresponding to the lightly doped layer 320. The third layer 430 is corresponding to the heavily doped layer 330. The thickness of the second layer 420 is greater than sum of a thickness of the first layer 410 and a thickness of the third layer 430. In order to simplify manufacture method and simplify structure of photo mask, the first layer 410 and the third layer 430 have same thickness preferably. In this embodiment, the gate insulation layer 400 could be for example SiNx/SiOx structure, but it is not limited thereto. In other embodiment, the gate insulation layer 400 also could be single layer of SiNx structure or SiOx structure.

The grid 500 is positioned on the first layer 410. The grid 500 could be MoAlMo structure or TiAlTi structure, and also could be single layer of Mo structure or single layer of Al structure. It is not limited thereto.

The layer insulation layer 600 is poisoned on the grid 500, the gate insulation layer 400 and the buffer layer 200. When there is no buffer layer 200 of the LTPS TFT, the layer insulation layer 600 is directly positioned on the grid 500, the gate insulation layer 400 and the substrate 100. The layer insulation layer 600 could be for example SiNx/SiOx structure, but it is not limited thereto. In other embodiment, the layer insulation layer 600 also could be single layer of SiNx structure or SiOx structure.

A first through hole 610 and a second through hole 620 are located in the layer insulation layer 600. The first through hole 610 passes through one part of the third layer 430, the second through hole 620 passes through other part of the third layer 430, which for respectively exposing the heavily doped layer 330.

The source 700 and the drain 800 are positioned on the layer insulation layer 600. The source 700 is filled to the first through hole 610 for contacting the correspondingly heavily doped layer 330. The drain 800 is filled to the second through hole 620 for contacting the correspondingly heavily doped layer 330. The source 700 and the drain 800 could be MoAlMo structure or TiAlTi structure, and also could be single layer of Mo structure or single layer of Al structure. It is not limited thereto.

The LTPS TFT 10 according to the embodiment of present invention which can be applied to display device, for example liquid crystal display or organic emitting display (Ex: OLED display). In an embodiment, the LTPS TFT 10 of this invention is applied to an OLED (organic light-emitting diodes) display device, and the details of which are described below.

Figure 2:
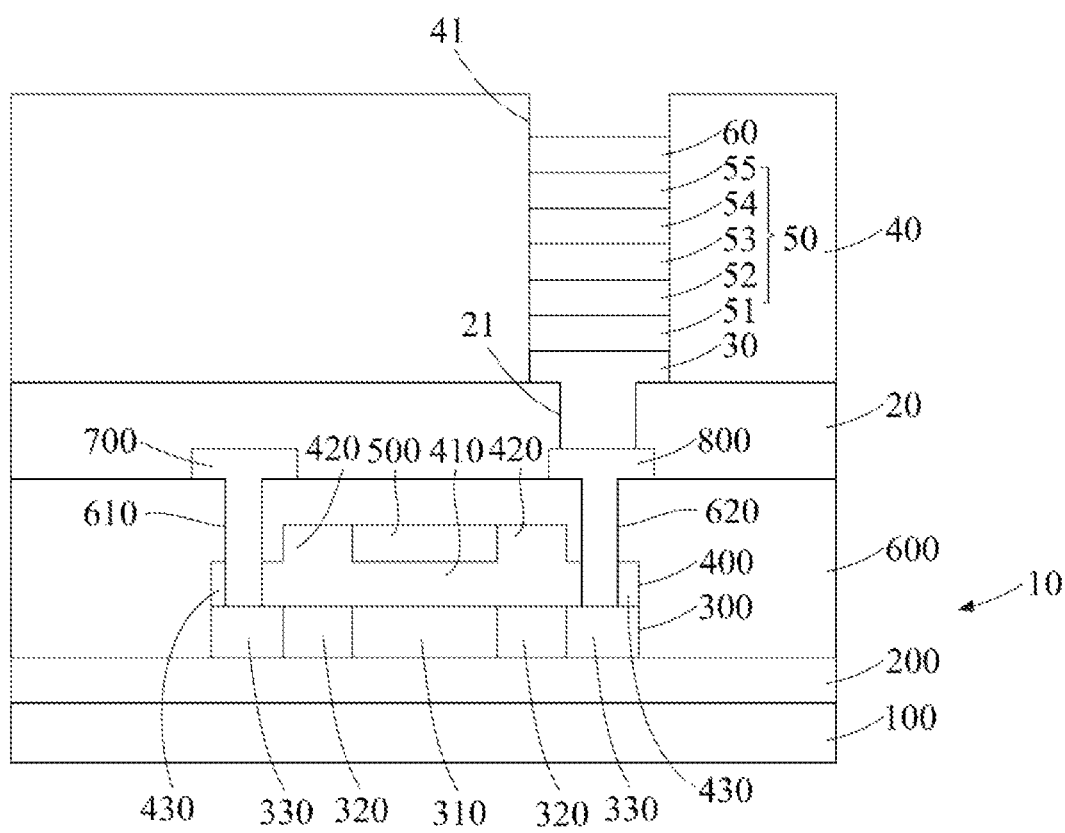
FIG. 2 is a structural schematic view of an OLED display device according to an embodiment of the disclosure.

FIG. 2 is a structural schematic view of an OLED display device according to an embodiment of the disclosure.

Please refer to FIG. 2. The OLED display device includes a LTPS TFT 10 shown as FIG. 1, a planar layer 20, a bottom electrode 30, a pixel defining layer 40, an OLED (organic light-emitting-diode) 50 and a top electrode 60.

The planar layer 20 is positioned on the layer insulation layer 600, the source 700 and the drain 800. A third through hole 21 is located in the planar layer 20 for exposing the drain 800.

The bottom electrode 30 is positioned on the planar layer, and the bottom electrode 30 is filled to the third through hole 31 for contacting to exposing the drain 800. The bottom electrode 30 is usually an anode. The bottom electrode 30 also could be a reflecting mirror. When observing the emitting of the OLED 50 by the substrate 100, the bottom electrode 30 is made by reflectively metal, and thin enough for having partial transmittance under the wave of emitting-light. It is called semi-transparent. Or the bottom electrode 30 is made by transparent metal-oxide for example Indium tin oxide (ITO) or zinc tin oxide (ZTO). When observing the emitting of the OLED 50 by the top electrode 60, the bottom electrode 30 could made by reflectively metal, and should be thick enough for basically opaque and also be fully reflecting mirror.

The pixel defining layer 40 is positioned on the planar layer 20 and the bottom electrode 30. A fourth is located in the pixel defining layer 40 for exposing the bottom electrode 30.

The OLED (organic light-emitting-diode) is positioned on the exposing bottom electrode 30. In this embodiment, tacking layers of the OLED are a hole injection layer (HIL) 51, a hole transport layer (HTL) 52, an organic emitting layer (EML) 53, an electron transport layer (ETL) 54 and a electron-injection layer (EIL) 55, and there are arranged in sequence from the bottom electrode 30 to the top electrode 60. The structure of OLED 50 in the present disclosure is not limited thereto.

The top electrode 60 is positioned on the OLED 50. The top electrode 60 is usually a cathode. The top electrode 60 also could be a reflecting mirror. When observing the emitting of the OLED 50 by the top electrode 60, the top electrode 60 is made by reflectively metal and thin enough for having partial transmittance under the wave of emitting-light. It is called semi-transparent. Or the top electrode 60 is made by transparent metal-oxide for example Indium tin oxide (ITO) or zinc tin oxide (ZTO). When observing the emitting of the OLED 50 by the substrate 100, the top electrode 60 could made by reflectively metal, and should be thick enough for basically opaque and also be fully reflecting mirror.

The detail of manufacture method of the LTPS TFT 10 of the embodiment in present invention will be described below.

FIG. 3A-3I is a process flow of manufacture method of LTPS TFT according to an embodiment of the disclosure.

The manufacture method of LTPS TFT, comprising following steps.

Figure 3A:
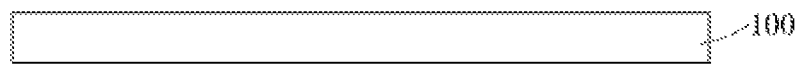
FIG. 3A-3I is a process flow of manufacture method of LTPS TFT according to an embodiment of the disclosure.

Step 1, please refer to FIG. 3A. Providing the substrate 100, the substrate 100 could be a transparent glass substrate or a resin substrate, the present disclosure is not limited thereto.

Figure 3B:

Step 2, please refer to FIG. 3B. Forming the buffer layer 200 on the substrate 100. The buffer layer 200 could be SiNx/SiOx structure, but the present disclosure is not limited thereto. For example the buffer layer 200 could be single layer of SiNx structure or SiOx structure. In another embodiment, there is no buffer layer 200. In addition, the step 2 can be omitted in another embodiment.

Figure 3C:
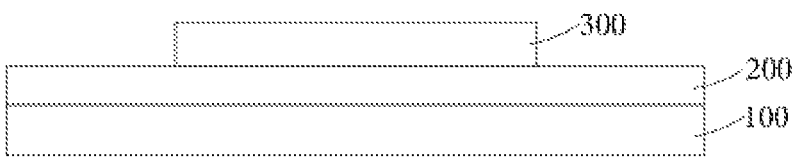

Step 3, please refer to FIG. 3C. Forming the poly-Si layer 300 on the buffer layer 200. In another embodiment, the poly-Si layer 300 is directly positioned on the substrate 100 when the step 2 is omitted. The specifically way to form the poly-Si layer 300 is that forming an amorphous silicon layer on the buffer layer 200 by PECVD (Plasma-enhanced chemical vapor deposition), and then forming crystal to the amorphous silicon layer by excimer laser processing. Therefore producing the poly-Si layer 300.

Figure 3D:
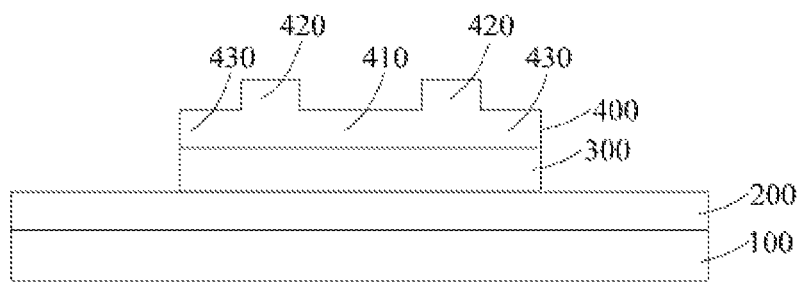

Step 4, please refer to FIG. 3D. Forming a gate insulation layer 400 on the poly-Si layer 300. The gate insulation layer 400 includes a first layer 410, a second layer 420 and a third layer 430. The third layers 430 are respectively positioned on two sides of the first layer 410. The second layer 420 is positioned between the first layer 410 and the third layer 430. The thickness of the second layer 420 is greater than sum of a thickness of the first layer 410 and a thickness of the third layer 430. In order to simplify manufacture method and simplify structure of photo mask, the first layer 410 and the third layer 430 have same thickness preferably. In this embodiment, the gate insulation layer 400 could be for example SiNx/SiOx structure, but it is not limited thereto. In other embodiment, the gate insulation layer 400 also could be single layer of SiNx structure or SiOx structure.

Figure 4A:
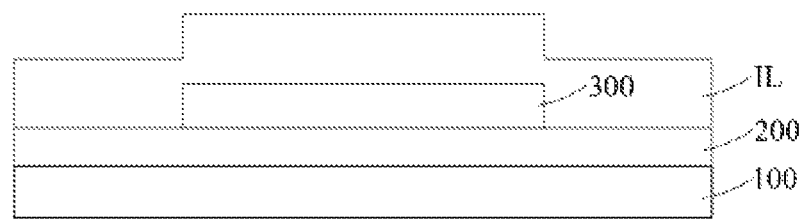
FIG. 4A to 4C is a process flow of manufacture method of gate insulation layer according to an embodiment of the disclosure.
Figure 4B:
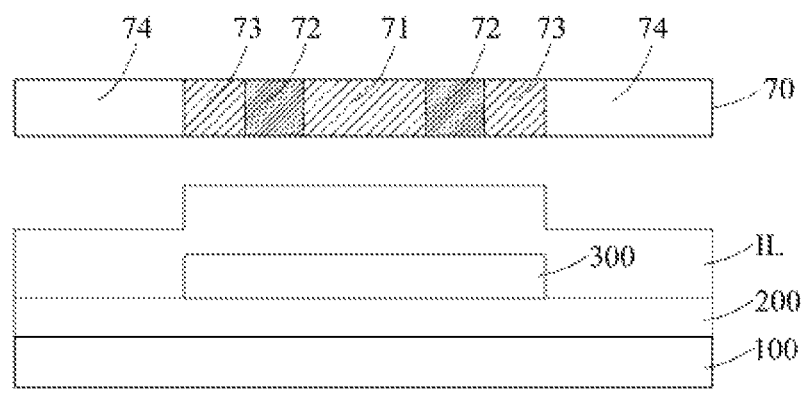
Figure 4C:
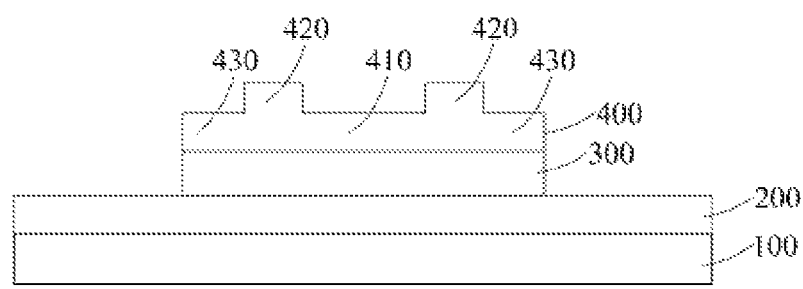

FIG. 4A to 4C is a process flow of manufacture method of gate insulation layer according to an embodiment of the disclosure.

Firstly, please refer to FIG. 4A. Forming an isolation material layer IL on the poly-Si layer 300 and the buffer layer. The isolation material layer IL could be SiNx/SiOx structure, but the present disclosure is not limited thereto. For example the isolation material layer IL could be single layer of SiNx structure or SiOx structure.

Then, please refer to FIG. 4B. Exposing the isolation material layer IL by a half tone mask 70. The half tone mask 70 comprises a first portion 71, a second portion 72, a third portion 73 and a fourth portion 74. The first portion 71 is corresponding to the first layer 410. The second portion 72 is corresponding to the second layer 420. The third portion 73 is corresponding to the third layer 430. The fourth portion 74 is corresponding to the isolation material layer IL on the buffer layer 200. The transmittance of the fourth portion 74 is greater than transmittance of the first portion 71, the second portion 72 and the third portion 73. The transmittance of the first portion 71 and the third portion 73 are greater than the second portion 72. Preferably, the first portion 71 and the third portion 73 have same transmittance.

Then, please refer to FIG. 4C. Developing and etching the exposed isolation material layer IL.

Figure 3E:
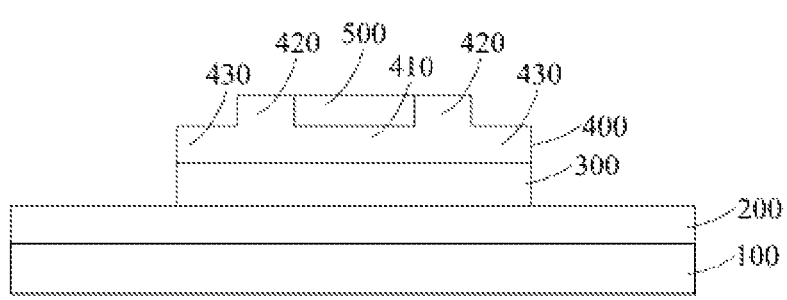

Step 5, please refer to FIG. 3E. Forming a grid 500 on the first layer 410. The grid 500 could be MoAlMo structure or TiAlTi structure, and also could be single layer of Mo structure or single layer of Al structure. It is not limited thereto.

Figure 3F:
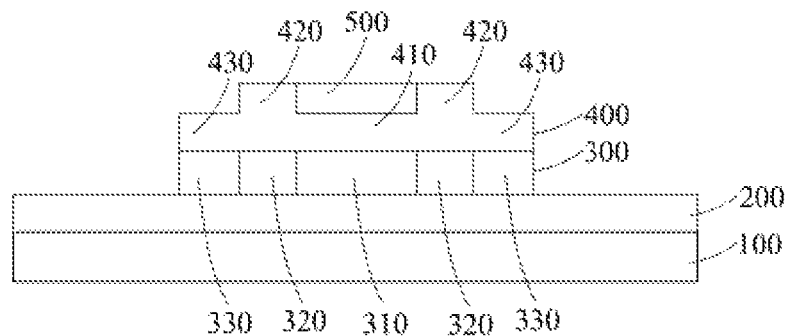

Step 6, please refer to FIG. 3F. Injecting ion into the poly-Si layer 300 for forming an undoped layer 310, a lightly doped layer 320 and a heavily doped layer 330. The undoped layer 310 is corresponding to the first layer 410. The lightly doped layer 320 is corresponding to the second layer 420. The heavily doped layer 330 is corresponding to the third layer 430. The injecting ion could be for example phosphorous ions, the present invention is not limited thereto. It also could be boron ions.

Figure 3G:
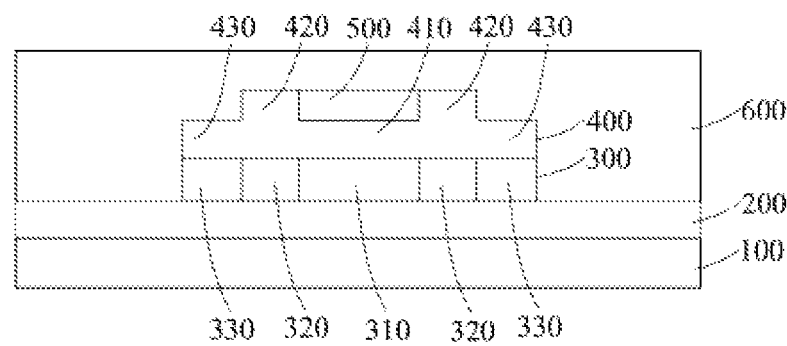

Step 7, please refer to FIG. 3G. Forming a layer insulation layer 600 on the grid 500, the gate insulation layer 400 and the buffer layer 200. In another embodiment, the layer insulation layer 600 is directly formed on the grid 500, the gate insulation layer 400 and the substrate 100 when the step 2 is omitted. The layer insulation layer 600 could be for example SiNx/SiOx structure, but it is not limited thereto. In other embodiment, layer insulation layer 600 also could be single layer of SiNx structure or SiOx structure.

Figure 3H:
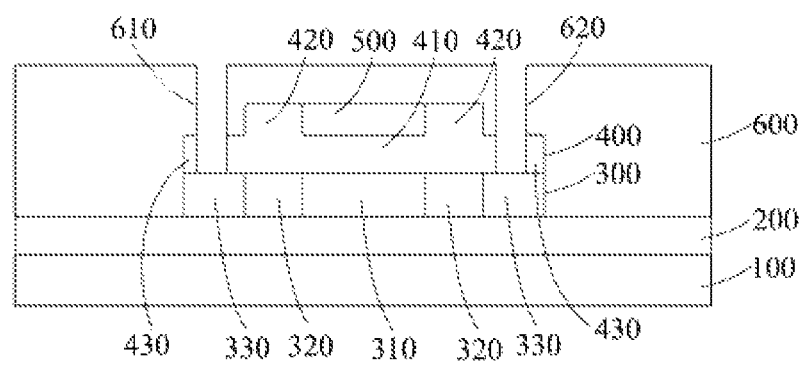

Step 8, please refer to FIG. 3H. Forming a first through hole 610 and a second through holed 620. The first through hole 610 passes through the layer insulation layer 600 and one part of the third layer 430, and the second through hole 620 passes through the layer insulation layer 600 and another part of the third layer 430.

Figure 3I:
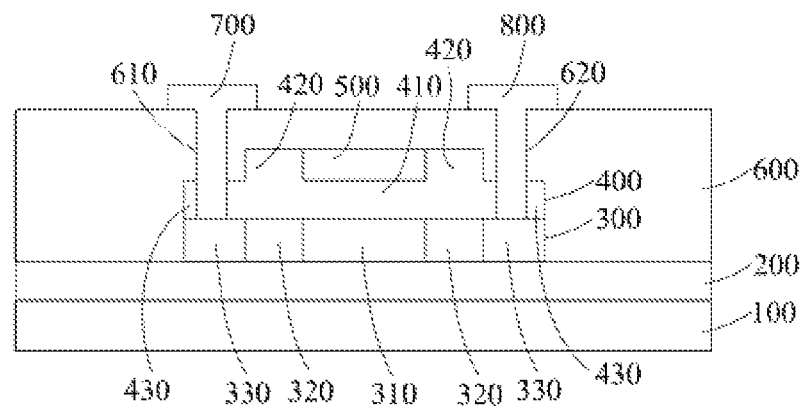

Step 8, please refer to FIG. 3I. Forming and filling the source 700 to the first through hole 610 for contacting the correspondingly heavily doped layer 330, and filing the drain 800 to the second through hole 620 for contacting the correspondingly heavily doped layer 330. The source 700 and the drain 800 could be MoAlMo structure or TiAlTi structure, and also could be single layer of Mo structure or single layer of Al structure. It is not limited thereto.

In summary, according to embodiments of the present invention. The advantages related to the present disclosure is that by using only one step for mask process, and forming heavily doped layer and light doped layer by one step ion injection which is simplify manufacture method and decreasing cost.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A LTPS TFT, comprising
a substrate;
a poly-Si layer at positioned on the substrate, and the poly-Si layer includes an undoped layer, heavily doped layers respectively positioned on two sides of the undoped layer, and a lightly doped layer positioned between the undoped layer and the heavily doped layer;
a gate insulation layer positioned on the poly-Si layer, the gate insulation layer includes a first layer corresponding to undoped layer, a second layer corresponding to the lightly doped layer and a third layer corresponding to the heavily doped layer, a thickness of the second layer is greater than sum of a thickness of the first layer and a thickness of the third layer;
a grid positioned on the first layer;
a layer insulation layer positioned on the grid, the gate insulation layer and the substrate;
a first through hole and a second through hole, the first through hole passes through the layer insulation layer and one part of the third layer, the second through hole passes through the layer insulation layer and another part of the third layer; and
a source and a drain positioned on the layer insulation layer, the source and the drain are respectively pass through the first through hole and the second through hole and correspondingly contact to the heavily doped layers.

2. The LTPS TFT according to claim 1, wherein the LTPS TFT further comprises a buffer layer positioned between the poly-Si layer and the layer insulation layer.

3. The LTPS TFT according to claim 1, wherein the lightly doped layer is n-type lightly doped layer, and the heavily doped layer is n-type heavily doped layer.

4. An OLED display device, comprising
a substrate;
a poly-Si layer at positioned on the substrate, and the poly-Si layer includes an undoped layer, heavily doped layers respectively positioned on two sides of the undoped layer, and a lightly doped layer positioned between the undoped layer and the heavily doped layers;
a gate insulation layer positioned on the poly-Si layer, the gate insulation layer includes a first layer corresponding to undoped layer, a second layer corresponding to the lightly doped layer and a third layer corresponding to the heavily doped layer, a thickness of the second layer is greater than sum of a thickness of the first layer and a thickness of the third layer;
a grid positioned on the first layer;
a layer insulation layer positioned on the grid, the gate insulation layer and the substrate;
a first through hole and a second through hole, the first through hole passes through the layer insulation layer and one part of the third layer, the second through hole passes through the layer insulation layer and another part of the third layer;
a source and a drain positioned on the layer insulation layer, the source and the drain are respectively pass through the first through hole and the second through hole and correspondingly contact to the heavily doped layers;
a planar layer positioned on the layer insulation layer, the source and the drain;
a third through hole passes through the planar layer for exposing the drain;
a bottom electrode positioned on the planar layer and contacted to the drain by the third through hole;
a pixel defining layer positioned on the planar layer and the bottom electrode;
a fourth through hole passes through the pixel defining layer for exposing the bottom electrode;

an OLED (organic light-emitting-diode) positioned on the bottom electrode; and
a top electrode positioned on the OLED.

5. The OLED display device according to claim 4, wherein the OLED further includes a hole injection layer, a hole transport layer, an organic emitting layer, an electron transport layer and a electron-injection layer arranged in sequence from the bottom electrode to the top electrode.

6. The OLED display device according to claim 4, wherein one of the bottom electrode and the top electrode is transparent or semi-transparent, another one is opaque and reflected.

7. The OLED display device according to claim 4, wherein the OLED display device further comprises a buffer layer positioned between the poly-Si layer and the layer insulation layer.

8. The OLED display device according to claim 4, wherein the lightly doped layer is n-type lightly doped layer, and the heavily doped layer is n-type heavily doped layer.

9. A manufacture method of LTPS TFT, comprising steps of:
providing a substrate;
forming a poly-Si layer on the substrate;
forming a gate insulation layer on the poly-Si layer, the gate insulation layer includes a first layer, third layers respectively positioned on two sides of the first layer, and a second layer positioned between the first layer and the third layer, a thickness of the second layer is greater than sum of a thickness of the first layer and a thickness of the third layer;
forming a grid on the first layer;
injecting ion into the poly-Si layer and forming an undoped layer corresponding to the first layer, a lightly doped layer corresponding to the second layer and a heavily doped layer corresponding to the third layer;
forming a layer insulation layer on the grid, the gate insulation layer and the substrate;
forming a first through hole and a second through holed on the layer insulation layer, and the first through hole passes through the layer insulation layer and one part of the third layer, and the second through hole passes through the layer insulation layer and other part of the third layer; and
forming and filling the source to the first through hole for contacting the correspondingly heavily doped layer, and filing the drain to the second through hole for contacting the correspondingly heavily doped layer.

10. The manufacture method of LTPS TFT according to claim 9, wherein before the step of forming a poly-Si layer on the substrate further comprises step of:
forming a buffer layer on the substrate;
wherein the step of forming a poly-Si layer on the substrate is substituted for the step of forming a poly-Si layer on the buffer layer;
wherein the step of forming a layer insulation layer on the grid, the gate insulation layer and the substrate is substituted for the step of forming a layer insulation layer on the grid, the gate insulation layer and the buffer layer.

11. The manufacture method of LTPS TFT according to claim 9, wherein specifically steps of forming a gate insulation layer on the poly-Si layer comprising:
forming an isolation material layer on the poly-Si layer and the substrate;
exposing the isolation material layer by a half tone mask;
wherein the half tone mask comprises a first portion corresponding to the first layer, a second portion corresponding to the second layer, a third portion corresponding to the third layer and a fourth portion corresponding to the isolation material layer on the substrate, transmittance of the fourth portion is greater than transmittance of the first portion, the second portion and the third portion, and transmittance of the first portion and the third portion are greater than the second portion; and
developing and etching the exposed isolation material layer.

12. The manufacture method of LTPS TFT according to claim 10, wherein specifically step of forming a gate insulation layer on the poly-Si layer comprising:
forming an isolation material layer on the poly-Si layer and the substrate;
exposing the isolation material layer by a half tone mask;
wherein the half tone mask comprises a first portion corresponding to the first layer, a second portion corresponding to the second layer, a third portion corresponding to the third layer and a fourth portion corresponding to the isolation material layer on the substrate, transmittance of the fourth portion is greater than transmittance of the first portion, the second portion and the third portion, and transmittance of the first portion and the third portion are greater than the second portion; and
developing and etching the exposed isolation material layer.

13. The manufacture method of LTPS TFT according to claim 9, wherein the lightly doped layer is n-type lightly doped layer, and the heavily doped layer is n-type heavily doped layer.

* * * * *